United States Patent
Zumkehr et al.

(10) Patent No.: US 6,864,731 B2
(45) Date of Patent: Mar. 8, 2005

(54) METHOD AND DEVICE FOR SYMMETRICAL SLEW RATE CALIBRATION

(75) Inventors: John F. Zumkehr, Orange, CA (US); James E. Chandler, Mission Viejo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/441,654

(22) Filed: May 19, 2003

(65) Prior Publication Data

US 2003/0201811 A1 Oct. 30, 2003

Related U.S. Application Data

(62) Division of application No. 09/823,442, filed on Mar. 30, 2001, now Pat. No. 6,617,895.

(51) Int. Cl.[7] .............................................. H03K 5/12
(52) U.S. Cl. ...................................... 327/170; 327/134
(58) Field of Search ................................ 327/170, 108, 327/112, 113, 131, 134, 136, 138, 263, 380, 381; 326/82, 83; 716/5, 6

(56) References Cited

U.S. PATENT DOCUMENTS

| | | | | |
|---|---|---|---|---|
| 5,256,964 A | * | 10/1993 | Ahmed et al. | 324/158.1 |
| 5,440,258 A | * | 8/1995 | Galbi et al. | 327/112 |
| 5,469,097 A | | 11/1995 | Ho | 327/170 |
| 5,621,335 A | | 4/1997 | Andresen | 326/30 |
| 5,703,496 A | * | 12/1997 | Sabin | 326/27 |
| 5,949,249 A | | 9/1999 | Preuss et al. | 326/27 |
| 5,959,481 A | | 9/1999 | Donnelly et al. | 327/170 |
| 6,047,346 A | | 4/2000 | Lau et al. | 710/126 |
| 6,075,379 A | | 6/2000 | Haider et al. | 326/21 |
| 6,081,134 A | | 6/2000 | Labram | 326/83 |
| 6,163,169 A | * | 12/2000 | Lawson | 326/58 |
| 6,166,562 A | | 12/2000 | Mita et al. | 326/83 |
| 6,172,541 B1 | | 1/2001 | Young et al. | 327/170 |
| 6,194,935 B1 | * | 2/2001 | Pioppo et al. | 327/170 |
| 6,265,921 B1 | | 7/2001 | Heinrich | 327/170 |
| 6,278,305 B1 | | 8/2001 | Tanaka | 327/170 |
| 6,307,441 B1 | | 10/2001 | Sharpe | 332/100 |
| 6,330,194 B1 | * | 12/2001 | Thomann et al. | 365/189.05 |
| 6,333,654 B1 | | 12/2001 | Harris et al. | 327/170 |
| 6,351,172 B1 | * | 2/2002 | Ouyang et al. | 327/333 |
| 6,452,428 B1 | * | 9/2002 | Mooney et al. | 327/108 |
| 6,489,807 B2 | * | 12/2002 | Genna et al. | 326/56 |
| 6,549,036 B1 | * | 4/2003 | Lee | 326/83 |
| 6,571,376 B1 | * | 5/2003 | Levin et al. | 716/5 |
| 6,617,895 B2 | * | 9/2003 | Zumkehr et al. | 327/170 |

* cited by examiner

Primary Examiner—Timothy P. Callahan
Assistant Examiner—Hai L. Nguyen
(74) Attorney, Agent, or Firm—Kenyon & Kenyon

(57) ABSTRACT

A device and method for calibrating a slew rate is disclosed. The slew rate may be for a driver of a bi-directional buffer. A driver outputs a signal having a frequency. A receiver is coupled to the driver. A frequency counter measures the frequency of the signal. A calibrated slew rate is determined by the frequency of a waveform of the signal. Different waveforms may be determined for the pull-up and pull-down calibrations.

12 Claims, 5 Drawing Sheets

METHOD AND DEVICE FOR SYMMETRICAL SLEW RATE CALIBRATION

RELATED APPLICATION

This application is a Divisional of patent application Ser. No. 09/823,442 filed on Mar. 30, 2001 now U.S. Pat. No. 6,617,895.

FIELD OF THE INVENTION

The present invention relates to controlling slew rates in signals. More particularly, the present invention relates to controlling the slew rates in drivers that use a push-pull design.

BACKGROUND OF THE INVENTION

High speed interfaces using double or quad transfer rates use clock and data signals that have controlled slew rates. Double Data Rate ("DDR") devices may use a source-synchronous clocking protocol to transfer data from the memory to the memory controller. The devices also may be known as "doublepump" devices. DDR devices using double transfer rates transfer data to and from the memory using both edges of the data strobes. Drivers that use a push-pull design should have slew rates that are controlled carefully and symmetrically in both high-to-low ("HL") and low-to-high ("LH") transitions because data is being sent or received depending on these transitions. If the HL or LH transition times of the control signals significantly differ, the interface may no longer be operable. Thus, these slew rates should remain constant even with variation in process, temperature and voltage, and the slew rate should be calibrated for a given process, temperature and voltage. A slow slew rate may result in noise problems, while a fast slew rate may result in ringing within the interfaces. Signal integrity of the DDR interface may demand that the slew rate be carefully controlled to prevent noise problems and ringing.

Current calibration methods may not compensate symmetrically or adequately in technology where the push-pull driver devices that do not track directly with each other over process, temperature and voltage. For example, in some devices, the LH transition may be done by P-doped devices, while the HL transition may be done by N-doped devices.

In one known method for slew rate calibration an analog-to-digital (A/D) converter is used. This method makes use of a resistor and changes the drive strength of the transistor driving the resistor. The voltage across the resistor is monitored and when a certain voltage is achieved, the system knows that calibration has been reached. This method is not very dynamic and does not measure the actual slew rate directly, but a parameter that contributes to the slew rate.

Thus, a need has arisen in the art to measure slew rate directly without additional elements attached or incorporated into the drivers.

DETAILED DESCRIPTION

One embodiment of the present invention is directed to a device on a processor having drivers with a slew rate controls. The device includes a driver that outputs a signal having a oscillation frequency. The device also includes a receiver coupled to the driver and a frequency counter to measure the frequency of the output signal. The device also includes a component to calibrate the slew rate for the driver. The calibrated slew rate may be set by controls coupled to the driver according to the frequency. The controls may receive the control values from look up tables correlating to the frequency.

Embodiments of the present invention may control the slew rate by varying the pre-driver strength to the output buffers. This process may have the effect of varying the resistance on an RC (resistance/capacitance) constant with the capacitance being fixed by the output transistor gate capacitance. The resistance (strength) of the pre-driver is varied by adding or subtracting parallel drivers as needed. Separate pre-driver strength controls may be provided for the pull-up and the pull-down output transistors so that symmetry as well as slew rate can be maintained.

To maintain and set a calibrated slew rate, a process monitor device may be used to determine what combination of slew rate controls is best. The slew rate controls may be contained in look up tables that have entries. To determine the correct setting for the pull-up and pull-down pre-drivers, two calibration setups are provided, one for pull-up and one for pull-down. The calibration uses a frequency based process monitor that measures the transition for the pull-up and pull-down of the output drivers. With this information, a processor, or its components, may program the slew rate appropriate for the current process.

Figure 1:
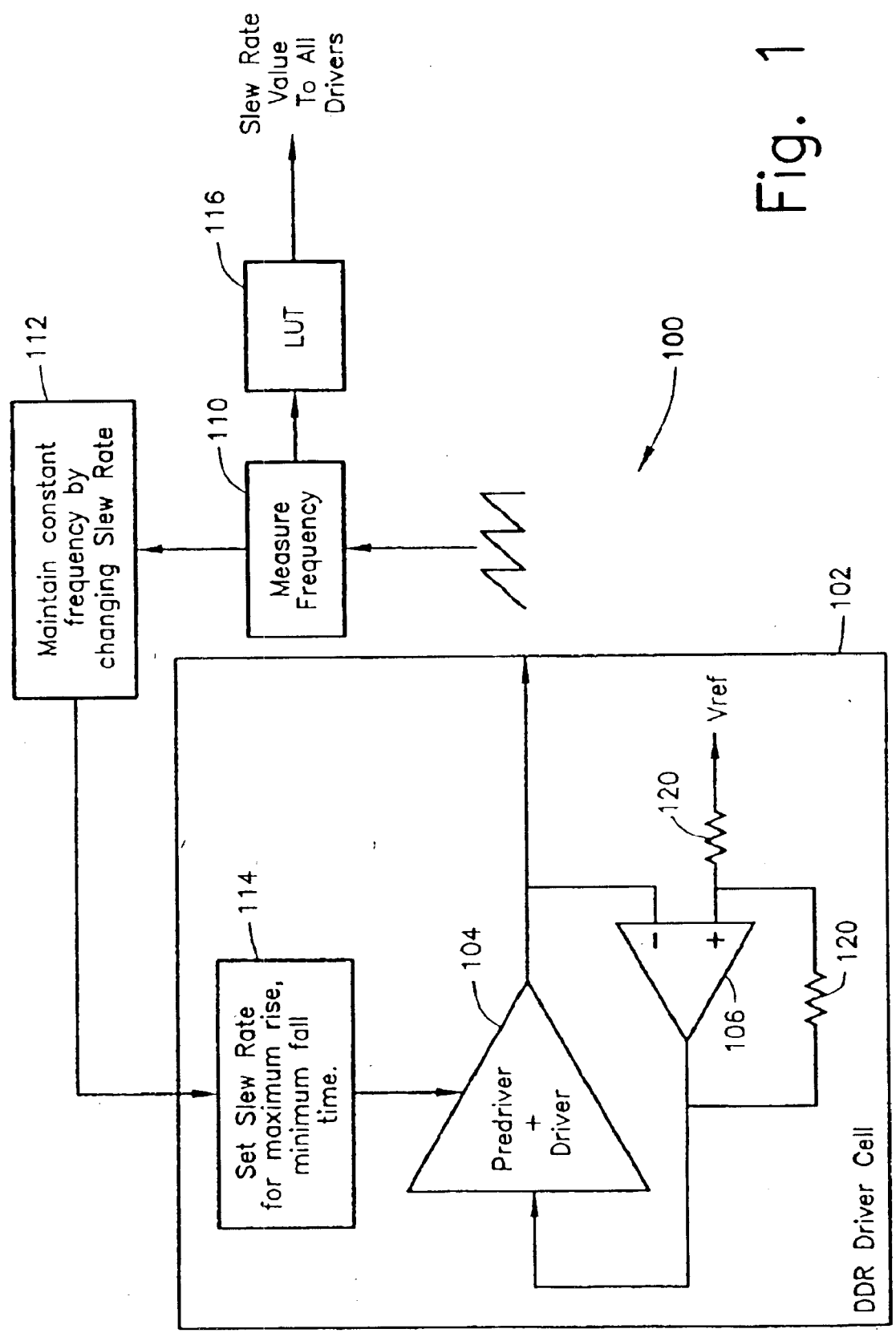
FIG. 1 is a block diagram of device for calibrating the slew rate for drivers constructed according to an embodiment of the present invention.

FIG. 1 depicts a device 100 for calibrating the slew rate for drivers on a processor in accordance with an embodiment of the present invention. Preferably, the drivers are input/output drivers that provide an interface to memory. Driver cell 102 may be one of the drivers. Driver cell 102 may be a buffer that receives and outputs data, and may include a driver 104 and a receiver 106. Resistors 120 may be coupled to receiver 106, with an input to receiver 106 coupled to a resistor 120 connected to a voltage. Driver cell 102 preferably is a bi-directional buffer that may be used for all operations.

Signal 108 may be output from driver 104. Signal 108 may be a data signal that is being sent or received from memory to driver cell 102. Signal 108 includes a frequency value and is a waveform having an amplitude. Further, signal 108 has low-to-high ("LH") and high-to-low ("HL") transition phases. Signal 108 can be used to determine the calibration controls appropriate for driver cell 106. Preferably, signal 108 oscillates through driver cell 102. Driver cell 102 may be in an oscillator in that it receives what it is driving out. While in oscillate mode, driver cell 102 brings signal 108 to a solitary waveform and may be a buffer that is used to measure the slew rate of driver cell 102.

Frequency counter 110 measures the frequency of signal 108 and may also determine the period of the waveform of signal 108. Frequency counter 110 then may pass on the frequency information to calibration control 112. Calibration control 112 maintains a constant frequency of signal 108 while changing the slew rate of driver cell 102, if needed. Calibration control 114 sets the slew rate in accordance with calibration control values received at driver cell 102. In the embodiment of FIG. 1, calibration control 114 sets the slew rate for maxim rise and minimum fall times. Frequency counter 110 also may send frequency information of signal 108 to look up table ("LUT") 116. LUT 116 can provide the appropriate calibration control values for the drivers in accordance with the frequency determined by frequency counter 110. The LUT can be implemented in a sparse format to save gates used for slew rate calibration. In a sparse LUT, the complete table used is stored in another location but only the immediate values needed to maintain the correct slew rate are stored locally.

Figure 2:
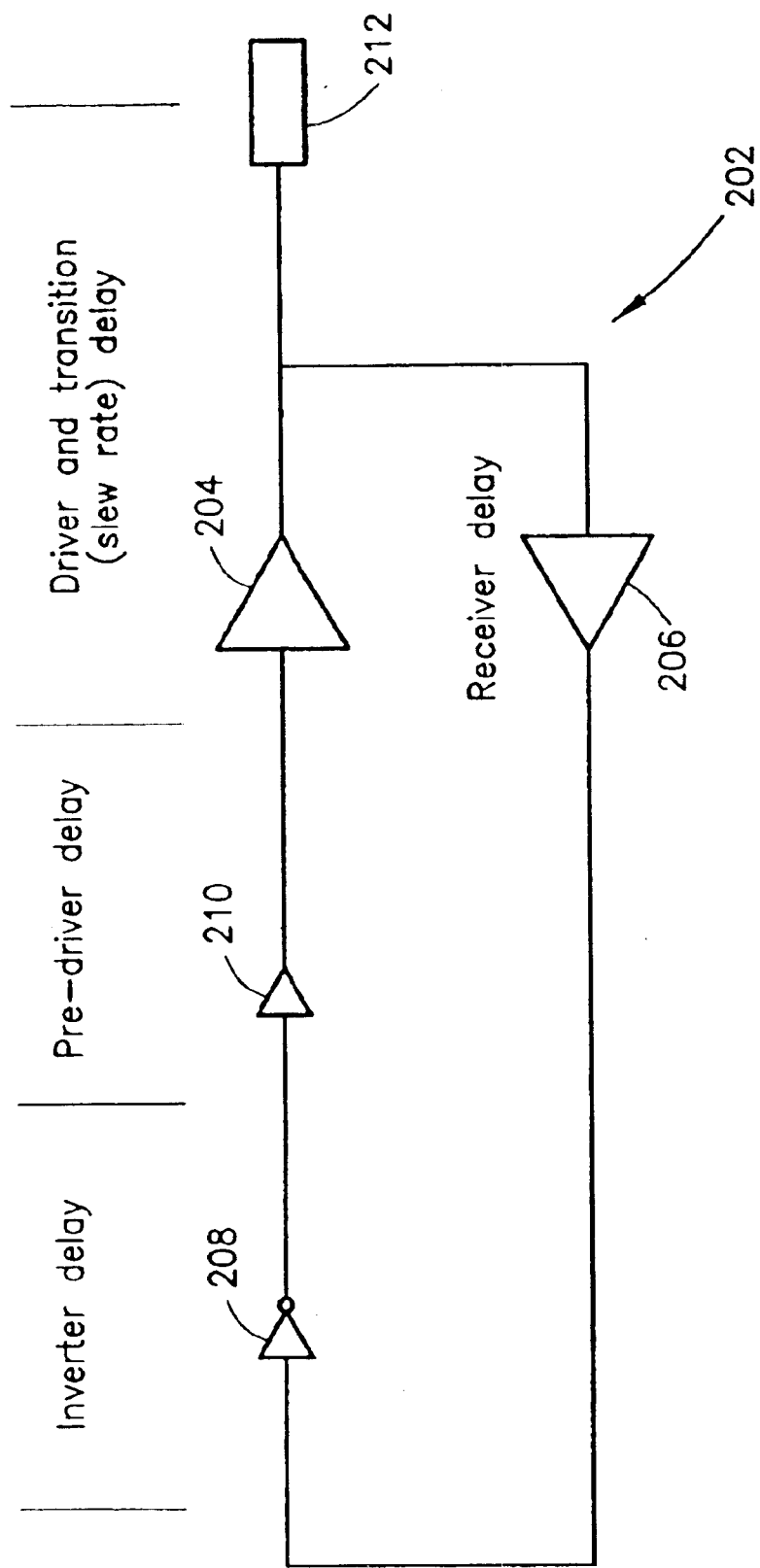
FIG. 2 is a block diagram of a driver cell constructed according to an embodiment of the present invention.

Thus, according to embodiments of the present invention, a buffer in the form of driver cell 102 is used to measure the slew rate by determining the frequency of a signal. The driver is programmed to be weak in the direction (pull-up or pull-down) of the calibration but strong in the direction not being calibrated. Ideally this results in a waveform that looks like a saw-tooth waveform and one could just measure the frequency of signal 108 and determine the period of the waveform to get the slew rate. This, however, may not be possible in driver cell 102. Intrinsic delays will be in the waveform of signal 108 due to logic and gates internal to driver cell 102. Referring to FIG. 2, a driver cell 202 is depicted according to an embodiment of the present invention. Driver cell 202 includes driver 204 and receiver 206. Further, logic elements 208 and 210 are coupled between receiver 206 and driver 204. These elements 208 and 210 may have delays associated with them in order to get driver cell 202 to oscillate. Further, elements 208 and 210 may represent intrinsic delays in the feedback loop of driver cell 202. These delays, however, should not have much to do with the transition time of the waveform for the signal through driver cell 202. Elements 208 and 210 have delays that driver cell 202 may not be able to remove from the waveform. Thus, calibration determinations should account for these intrinsic delays in calibrating the slew rate.

Figure 3:
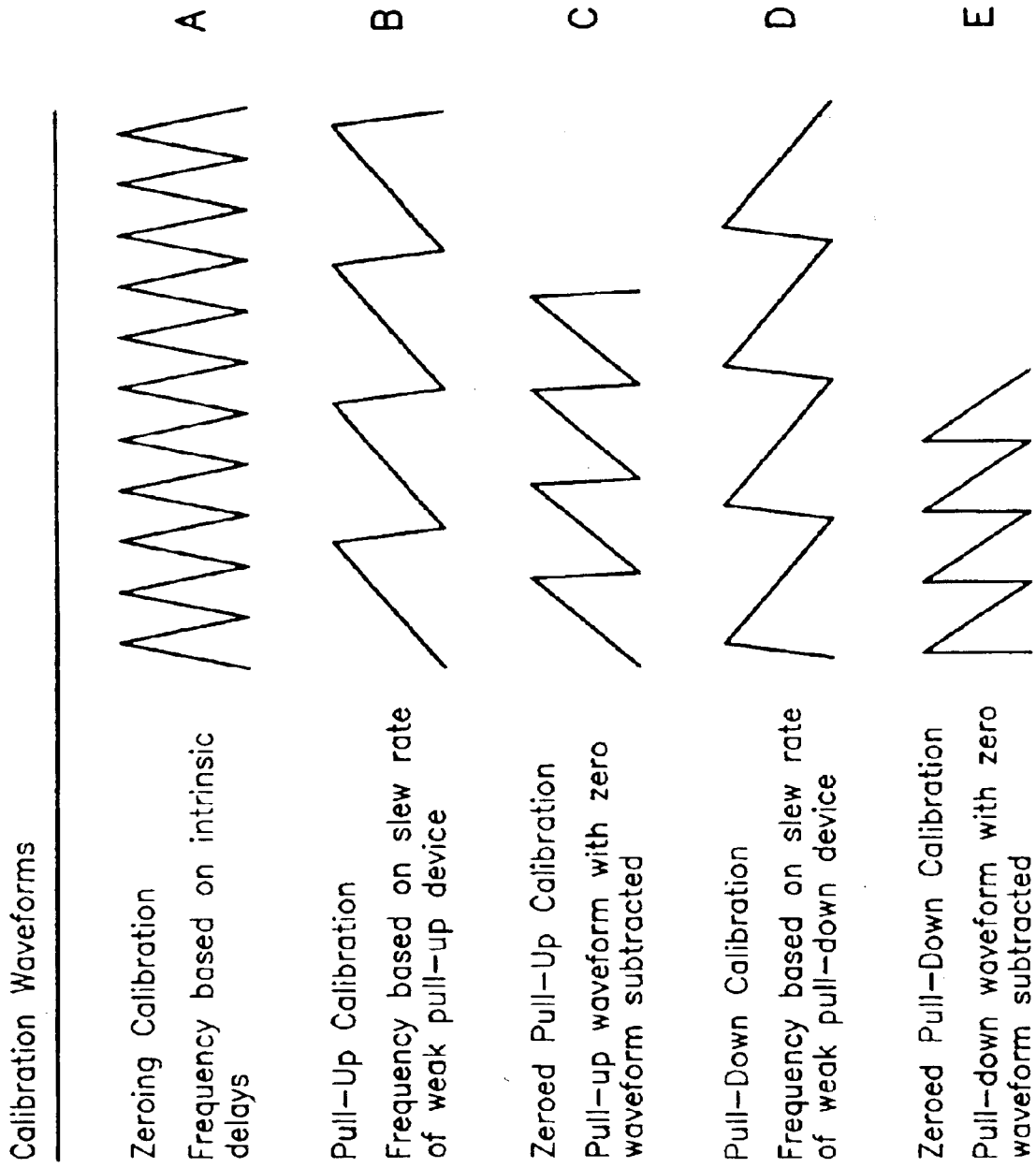
FIG. 3 depicts calibration waveforms that can be used to calibrate slew rats in accordance with an embodiment of the present invention.

FIG. 3 depicts waveforms through a driver to be used for calibrating slew rates in accordance with an embodiment of the present invention. Referring back to FIG. 1, the waveforms may coincide with signal 108 as it passes through driver cell 102. Waveform A is the waveform of signal 108 with zero calibration. Here, the transition delays are "zeroed out" in that driver cell 102 is run as an oscillator with the slew rate to the maximum amount. When run at the maximum slew rate, the transition times for LH and HL should be as small as they can be. Thus, any delay is due to intrinsic delays, as disclosed above. Intrinsic delays may occur by going through the feedback loop, as disclosed with reference to FIG. 2. Waveform A, therefore, represents the portion of the slew rate that should not be able to be removed from signal 108.

Waveform B depicts the pull-up calibration waveform where the LH transition controls are set to a minimum value, and the HL transition controls are set to a maximum value. The frequency of waveform B should be based on the slew rate of a weak pull-up device. Most of the period of waveform B should be for the LH transition. Waveform C depicts the zeroed pull-up calibration waveform for driver cell 102. Waveform C may be determined by subtracting waveform A from waveform B. This action removes the intrinsic delays from waveform B's pull-up calibration. Waveform C should represent the ideal LH, or pull-up, waveform for driver cell 102.

A similar process is repeated with respect to the pull-down transition. Waveform D depicts the pull-down calibration waveform where the HL transition controls are set to a minimum value, and the LH transition controls are set to a maximum value. The frequency of waveform D should be based on the slew rate of a weak pull-down device. Most of the period of waveform D should be for the HL transition. Waveform E depicts the zeroed pull-down calibration waveform for driver cell 102. Waveform E may be determined by subtracting waveform A from waveform D. This action removes the intrinsic delays from waveform D's pull-down calibration. Waveform E should represent the ideal HL, or pull-down, waveform for driver cell 102.

Waveforms C and E then may be used to determine the slew rate controls to be used to produce the slew rate for driver cell 102. Frequency counter 110 may determine the frequency and period of waveforms C and E for each specific transition. Thus, the appropriate controls may be selected for each transition by scaling the resistance appropriately given the frequency calculated during calibration. For instance if the desired pull-up slew rate is ten times that of the value calculated by the weak pull-up, the resistance value of the RC in the pre-driver is multiplied by 10.

Figure 4A:
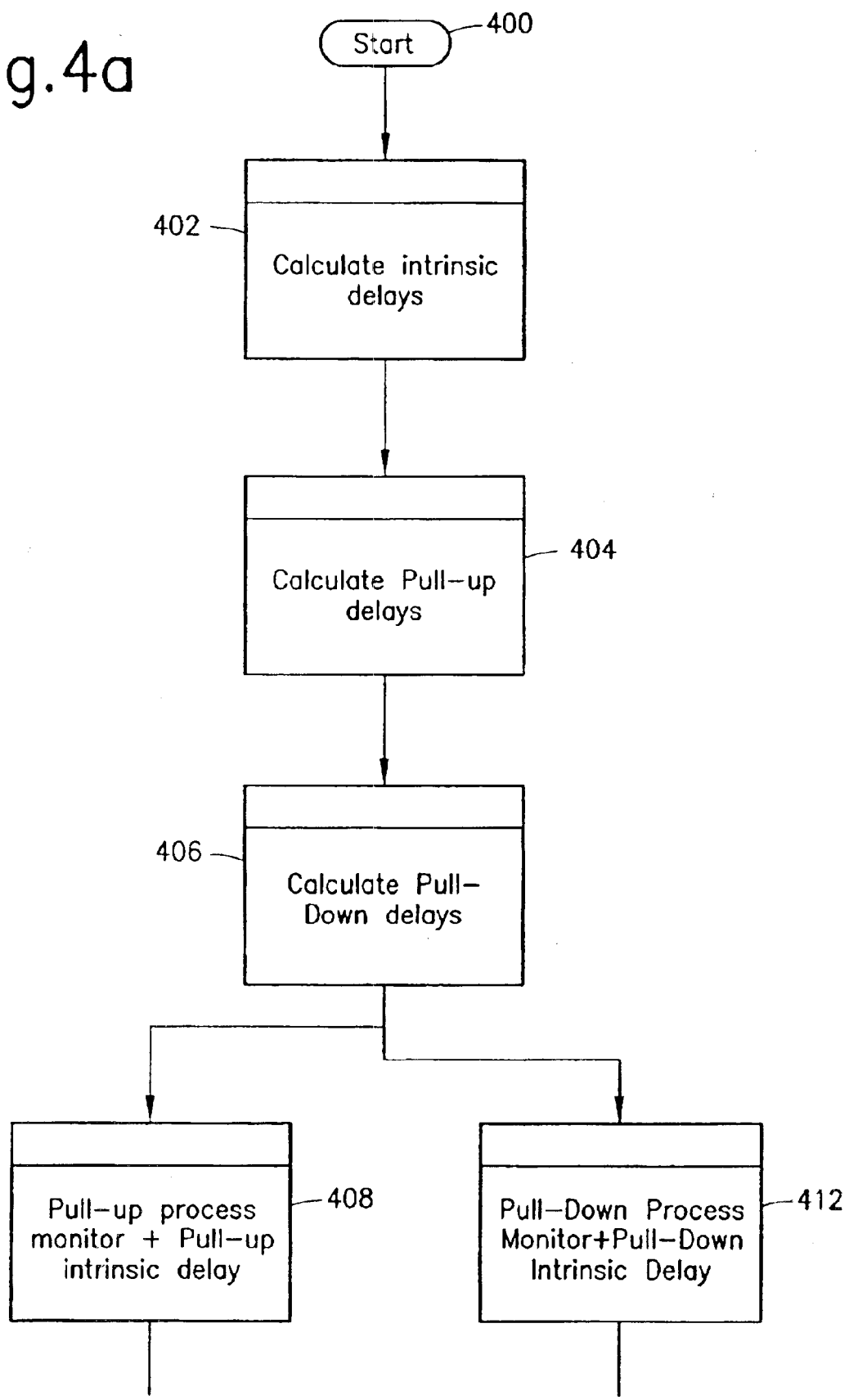
FIG. 4 is a flow diagram of a method for calibrating the slew rate for drivers according to an embodiment of the present invention.
Figure 4B:
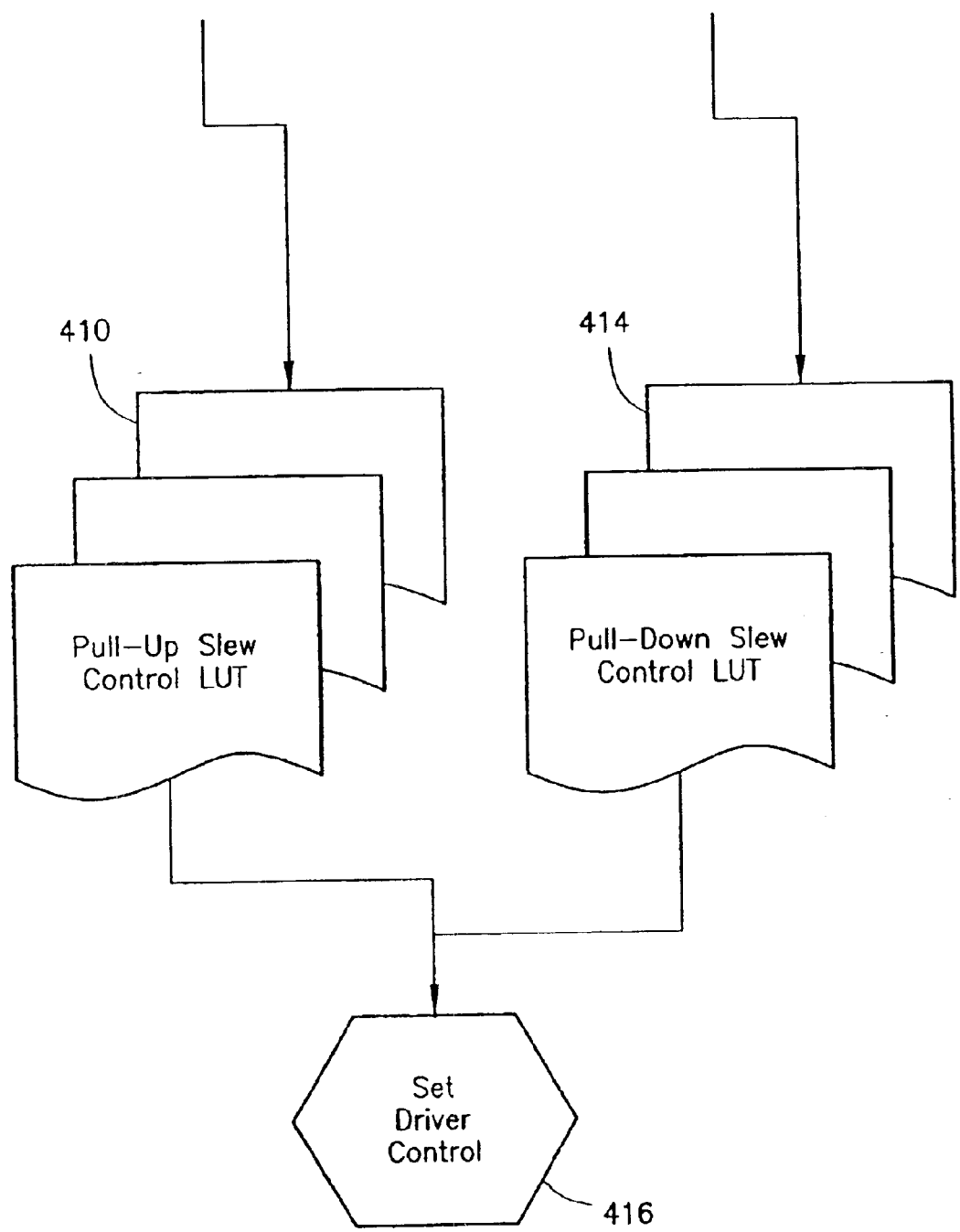

FIG. 4 depicts a flowchart of a method for calibrating a slew rate in accordance with an embodiment of the present invention. The method may be implemented as instructions stored in a memory and executed by a processor. Further, the instructions may be stored in any computer readable medium. Block 400 starts the method for calibrating the slew rate. Block 402 calculates the intrinsic delays within the driver cell. For example, the parameters of waveform A are calculated. In block 404, the pull-up delays within the slew rate are calculated. For example, the parameters of waveform B are calculated. In block 406, the pull-down delays are calculated within the slew rate. For example, waveform D is calculated. In blocks 408 and 412, the pull-up process monitor and pull-down process monitor are used separately to determine the effect of the settings in waveforms B and D on the period of the buffer in this embodiment. In other words, the circuit of FIG. 1 may be used to calculate waveform C by subtracting the intrinsic delays from the pull-up delay waveform B (block 408) and to calculate waveform E by subtracting the intrinsic delays from the pull-down delay waveform D (block 412). With these values, the appropriate values to be used to control the period and frequency of the output signal can be applied to the drivers based on the current process, temperature, and voltage. For example, in blocks 410 and 414, the respective controls for the pull-up and pull-down slew rates are determined.

Referring back to FIG. 1, using the frequency of the determined waveforms, for example, waveforms C and E, frequency counter 110 can determine the period of the waveforms and use this information to access LUTs to set the calibration controls. For example, frequency counter 110 may have values from 0–15, or 4 bits, for the frequency of the waveforms. LUT 116 would have 16 entries in the table based on the frequency number detected. Thus, in block 410, the pull-up calibration determination would result in a value that correlates to an entry in LUT 116. In block 414, the pull-down calibration determination would result in a value that correlates to an entry within another LUT 116. Different sets of control values would be available for each calibration. In block 416 the driver controls are set according to the values in the LUTs.

By using LUTs, solutions are predefined based on mathematical or empirical derived values. According to the detected frequency value for the pull-up and pull-down calibrated waveforms, a certain set of control values would be desirable. Alternatively, embodiments of the present invention may use formulas instead of LUTs. A frequency value would be placed in the formula to determine the appropriate control values for the drivers.

In another embodiment of the present invention, the LUTs, such as LUT 116, may be sparse look-up tables. These tables may be stored on-chip. Normally, the LUTs may be stored in a Basic Input/Output System ("BIOS") memory and accessed each time a frequency determined is made by frequency counter 110. However, sparse tables may reduce accesses to the BIOS memory by storing averages of certain frequency values after an initial calibration. After the initial calibration, frequency values are read out and averaged into a table on the chip. Preferably, this table is smaller than the LUT in the BIOS memory. For example, sparse LUT may pull out the values surrounding the frequency count value of 2 by averaging the values of 1 and 3, or even 0 and 4. This average values then may be stored in the sparse LUT on-chip.

Thus, embodiments of the present invention seek to keep slew rates constant even with variation in process, temperature and voltage by calibrating the slew rate for a given process, temperature and voltage. Embodiments of the present invention may compensate symmetrically where the push-pull driver uses devices that do not track directly with each other. An accurate calibration is done for both the LH and HL transitions.

Thus, it is apparent that there has been provided, in accordance with the embodiments of the present invention disclosed above, a method and apparatus recovering registers for a register renaming structure. Although the present invention has been disclosed in detail, it should be understood that various changes, substitutions, and alterations may be made herein. Moreover, although software and hardware are described to control certain functions, such functions can be performed using either software, hardware or a combination of software and hardware, as is well known in the art. Other examples are readily ascertainable by one skilled in the art and may be made without departing from the spirit and scope of the present invention as defined by the following claims.

What is claimed is:

1. A method for calibrating a slew rate in a driver, comprising:
    calculating a pull-up delay in said driver;
    calculating a pull-down delay in said driver;
    calculating an intrinsic delay;
    determining a calibrated slew rate according to said delays; and
    setting driver controls to said calibrated slew rate.

2. The method of claim 1, wherein said determining includes subtracting said intrinsic delay from said pull-up delay.

3. The method of claim 1, wherein said determining includes subtracting said intrinsic delay from said pull-down delay.

4. The method of claim 1, wherein said determining includes looking up slew control values in look up tables.

5. The method of claim 1, wherein said setting includes setting controls according to said slew control values.

6. The method of claim 4, wherein said look up tables are sparse look up tables.

7. A set of instructions residing in a storage medium, said set of instructions capable of being executed by a processor to implement a method for calibrating a slew rate in a driver the method comprising:
    calculating a pull-up delay in said driver;
    calculating a pull-down delay in said driver;
    calculating an intrinsic delay;
    determining a calibrated slew rate according to said delays; and
    setting driver controls to said calibrated slew rate.

8. The set of instructions of claim 7, wherein said determining includes subtracting said intrinsic delay from said pull-up delay.

9. The set of instructions of claim 7, wherein said determining includes subtracting said intrinsic delay from said pull-down delay.

10. A set of instructions residing in a storage medium, said set of instructions capable of being executed by a processor to implement a method for calibrating a slew rate in a driver, the method comprising:
    calculating a pull-un delay in said driver;
    calculating a pull-down delay in said driver;
    determining a calibrated slew rate according to said delays by looking up slew control values in look up tables; and
    setting driver controls to said calibrated slew rate.

11. The set of instructions of claim 10, wherein said setting includes setting controls according to said slew control values.

12. The set of instructions of claim 10, wherein said look up tables are sparse look up tables.

* * * * *